(12) United States Patent
Kim

(10) Patent No.: US 10,419,003 B1
(45) Date of Patent: Sep. 17, 2019

(54) GRAY CODE GENERATOR

(71) Applicant: Samsung Electronics Co., Ltd., Suwon-si, Gyeonggi-do (KR)

(72) Inventor: Sungyong Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/209,195

(22) Filed: Dec. 4, 2018

(30) Foreign Application Priority Data

Mar. 22, 2018 (KR) .................. 10-2018-0033302

(51) Int. Cl.
*H03K 23/00* (2006.01)
*H03M 7/16* (2006.01)

(52) U.S. Cl.
CPC ............ *H03K 23/005* (2013.01); *H03M 7/16* (2013.01)

(58) Field of Classification Search
CPC .............................. H03K 23/005; H03M 7/16
See application file for complete search history.

(56) References Cited

U.S. PATENT DOCUMENTS

| | | | |
|---|---|---|---|
| 6,907,098 B2* | 6/2005 | Nakamura | H03K 23/005 377/111 |
| 6,931,091 B2* | 8/2005 | Heimbigner | H03K 19/215 377/34 |
| 7,149,275 B1 | 12/2006 | Hubbard | |
| 7,596,201 B2 | 9/2009 | Fujimura | |
| 8,102,449 B2 | 1/2012 | Kudo | |
| 8,421,891 B2 | 4/2013 | Morikawa et al. | |
| 9,053,999 B2 | 6/2015 | Iwaki et al. | |
| 9,621,169 B2 | 4/2017 | Liu | |

FOREIGN PATENT DOCUMENTS

| | | |
|---|---|---|
| JP | H10-028048 A | 1/1998 |
| JP | 2002-111482 A | 4/2002 |
| KR | 10-0595385 B1 | 6/2006 |

* cited by examiner

*Primary Examiner* — Patrick O Neill
(74) *Attorney, Agent, or Firm* — Harness, Dickey & Pierce, P.L.C.

(57) ABSTRACT

Disclosed is a gray code generator. The gray code generator includes a counter that counts first to fourth digital bits in response to a clock signal, and a converter that converts the first to fourth digital bits to first to fourth gray bits. The counter includes a replica flip-flop that outputs the clock signal as the first digital bit, a first flip-flop that inverts the second digital bit in response to the clock signal to output the second digital bit, a second flip-flop that outputs a high level in response to the clock signal when a second inverted digital bit is different from a third inverted digital bit, and a third flip-flop that outputs the high level in response to the clock signal when a result of performing a NOR operation on the second and third inverted digital bits is different from a fourth inverted digital bit.

20 Claims, 15 Drawing Sheets

GRAY CODE GENERATOR

CROSS-REFERENCE TO RELATED APPLICATIONS

This application claims priority under 35 U.S.C. § 119 to Korean Patent Application No. 10-2018-0033302 filed on Mar. 22, 2018, in the Korean Intellectual Property Office, the disclosure of which is incorporated by reference herein in its entirety.

BACKGROUND

Example embodiments of the inventive concepts disclosed herein relate to a semiconductor circuit. For example, at least some example embodiments relate to a gray code generator.

A gray code generator may generate a gray code which sequentially varies. The gray code generator may be used in various electronic devices. For example, the gray code generator may be used to convert an analog voltage obtained from an image sensor to a gray code being a digital value.

There is a desire to reduce power consumption of electronic device while making an operating speed higher. Since the gray code generator performs a count operation during a time corresponding to a voltage, the operating speed and power consumption of the gray code generator may have a significant influence on the operating speed and power consumption of the electronic device including the gray code generator and the image sensor.

Accordingly, there is an increasing demand for a gray code generator having an improved operating speed and reduced power consumption.

SUMMARY

Example embodiments of the inventive concepts provide a gray code generator having an improved operating speed, reduced power consumption and/or an improved linearity.

According to an example embodiment, a gray code generator includes a converter configured to convert digital bits to gray bits, the digital bits including a first digital bit, a second digital bit, a third digital bit and a fourth digital bit, and the gray bits including a first gray bit, a second gray bit, a third gray bit and a fourth gray bit; and a counter configured to generate the digital bits by performing a counting operation in response to a clock signal, the counter including, a replica counter flip-flop configured to output the clock signal as the first digital bit, and a plurality of counter flip-flops including, a first counter flip-flop configured to output the second digital bit, in response to the clock signal, a second counter flip-flop configured to output a high level as the third digital bit in response to the clock signal when a second inverted digital bit corresponding to an inverted version of the second digital bit is different from a third inverted digital bit corresponding to an inverted version of the third digital bit, and a third counter flip-flop configured to output the high level as the fourth digital bit in response to the clock signal when a result of performing a NOR operation on the second inverted digital bit and the third inverted digital bit is different from a fourth inverted digital bit, the fourth inverted digital bit corresponding to an inverted version of the fourth digital bit.

According to an example embodiment, a gray code generator includes a counter configured to generate digital bits by performing a counting operation in response to a clock signal, the digital bits including a first digital bit, a second digital bit, a third digital bit and a fourth digital bit; and a converter configured to convert the digital bits to gray bits, the gray bits including a first gray bit, a second gray bit, a third gray bit and a fourth gray bit, the converter including, a plurality of converter flip-flops including a first converter flip-flop, a second converter flip-flop and a third converter flip-flop, the plurality of converter flip-flops configured to convert respective ones of the first digital bit, the second digital bit and the third digital bit to respective ones of the first gray bit, the second gray bit and the third gray bit; and a replica converter flip-flop configured to convert the fourth digital bit to the fourth gray bit.

According to an example embodiment, a gray code generator includes a counter configured to generate digital bits by performing a counting operation in response to a clock signal, the digital bits including a first digital bit, a second digital bit, a third digital bit and a fourth digital bit; the counter including, a first counter flip-flop configured to generate the second digital bit, in response to the clock signal; a second counter flip-flop configured to output a high level as the third digital bit in response to the clock signal when a second inverted digital bit corresponding to an inverted version of the second digital bit is different from a third inverted digital bit corresponding to an inverted version of the third digital bit; and a third counter flip-flop configured to output the high level as the fourth digital bit in response to the clock signal when a result of performing a NOR operation on the second inverted digital bit and the third inverted digital bit is same as a fourth inverted digital bit, the fourth inverted digital bit corresponding to an inverted version of the fourth digital bit; and a converter configured to convert the digital bits to gray bits, the converter including a first converter flip-flop, a second converter flip-flop and a third converter flip-flop configured to convert respective ones of the first digital bit, the second digital bit and the third digital bit to respective ones of a first gray bit, a second gray bit and a third gray bit included in the gray bits.

BRIEF DESCRIPTION OF THE FIGURES

The above and other objects and features of example embodiments of the inventive concepts will become apparent by describing in detail some example embodiments thereof with reference to the accompanying drawings.

DETAILED DESCRIPTION

Below, example embodiments of the inventive concepts may be described in detail and clearly to such an extent that an ordinary one in the art easily implements the inventive concepts.

Figure 1:
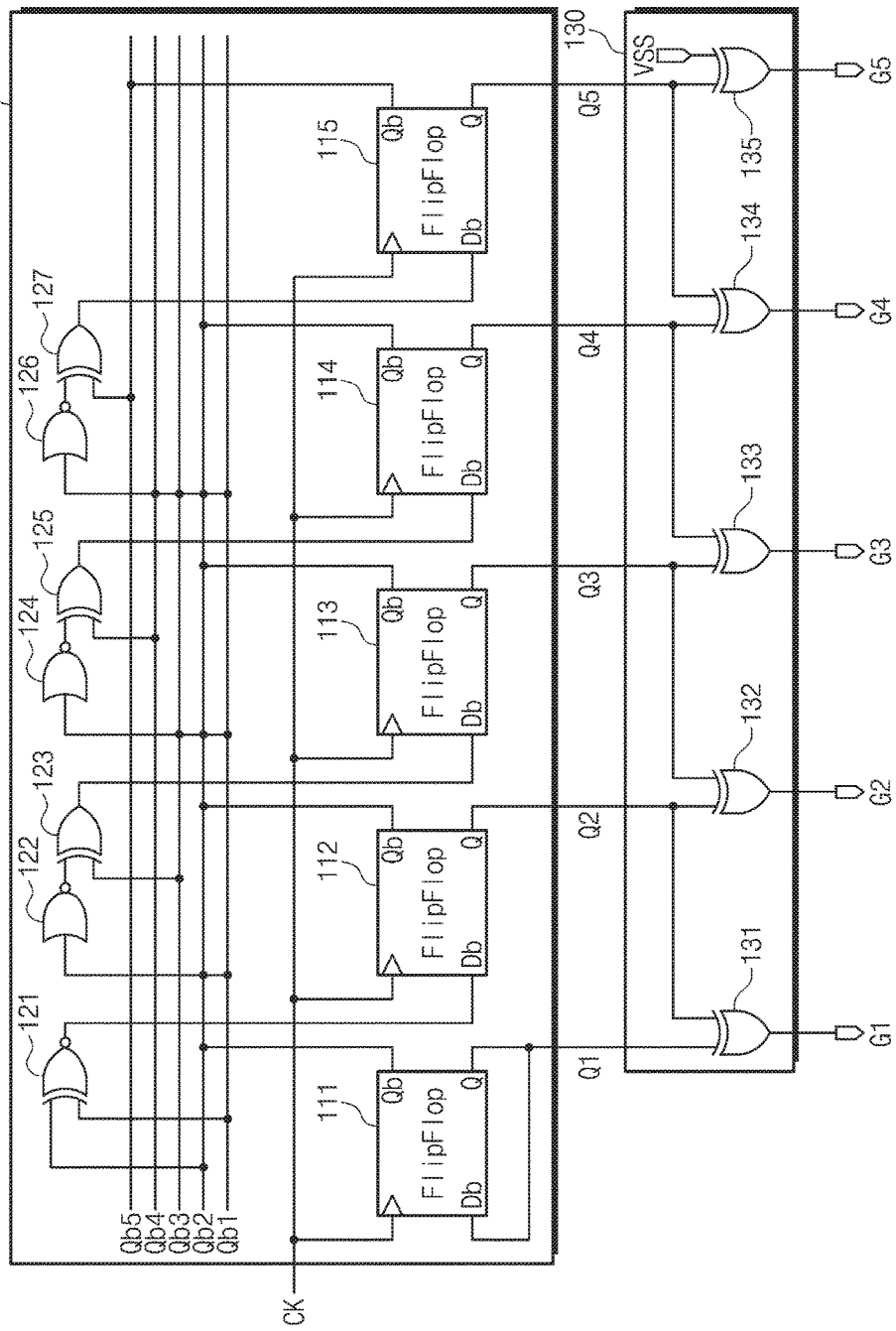
FIG. 1 is a diagram illustrating a gray code generator according to an example embodiment of the inventive concepts.

FIG. 1 is a diagram illustrating a gray code generator 100 according to an example embodiment of the inventive concepts.

Referring to FIG. 1, the gray code generator 100 includes a counter 110 and a converter 130.

The counter 110 may count digital bits Q1 to Q5 constituting a binary code in response to a clock signal CK. For example, the counter 110 may sequentially increase the digital bits Q1 to Q5.

The counter 110 includes first to fifth flip-flops 111 to 115, and first to seventh counter logical operators 121 to 127. Each of the flip-flops 111 to 115 may include a clock input to which the clock signal CK is input, an input Db, a positive output "Q", and a negative output "Qb".

Each of the flip-flops 111 to 115 may invert a logical level (e.g., a high level or a low level) of the input Db in synchronization with a falling edge of the clock signal CK and may transmit a result of the inversion to the positive output "Q". Each of the flip-flops 111 to 115 may transmit a logical level of the input Db to the negative output Qb in synchronization with the falling edge of the clock signal CK.

The input Db and the positive output "Q" of the first flip-flop 111 may be connected to each other. The positive output "Q" of the first flip-flop 111 may output a first digital bit Q1. The negative output Qb of the first flip-flop 111 may output a first inverted digital bit Qb1.

The first counter logical operator 121 may perform an exclusive NOR (XNOR) operation on the first inverted digital bit Qb1 and a second inverted digital bit Qb2. That is, the first counter logical operator 121 may output the high level when the first and second inverted digital bits Qb1 and Qb2 are identical to each other, and may output the low level otherwise.

An output of the first counter logical operator 121 may be provided to an input Db of the second flip-flop 112. A positive output "Q" of the second flip-flop 112 may output a second digital bit Q2. A negative output Qb of the second flip-flop 112 may output the second inverted digital bit Qb2.

The second counter logical operator 122 may perform a NOR operation on the first inverted digital bit Qb1 and the second inverted digital bit Qb2. That is, the second counter logical operator 122 may output the high level when the first and second inverted digital bits Qb1 and Qb2 are the low level, and may output the low level otherwise.

The third counter logical operator 123 may perform an XOR operation on an output of the second counter logical operator 122 and a third inverted digital bit Qb3. That is, the third counter logical operator 123 may output the high level when the output of the second counter logical operator 122 is identical to the third inverted digital bit Qb3, and may output the low level otherwise.

An output of the third counter logical operator 123 may be provided to an input Db of the third flip-flop 113. A positive output "Q" of the third flip-flop 113 may output a third digital bit Q3. A negative output Qb of the third flip-flop 113 may output the third inverted digital bit Qb3.

The fourth counter logical operator 124 may perform a NOR operation on the first to third inverted digital bits Qb1 to Qb3. The fifth counter logical operator 125 may perform an XOR operation on an output of the fourth counter logical operator 124 and a fourth inverted digital bit Qb4.

An output of the fifth counter logical operator 125 may be provided to an input Db of the fourth flip-flop 114. A positive output "Q" of the fourth flip-flop 114 may output a fourth digital bit Q4. A negative output Qb of the fourth flip-flop 114 may output the fourth inverted digital bit Qb4.

The sixth counter logical operator 126 may perform a NOR operation on the first to fourth inverted digital bits Qb1 to Qb4. The seventh counter logical operator 127 may perform an XOR operation on an output of the sixth counter logical operator 126 and a fifth inverted digital bit Qb5.

An output of the seventh counter logical operator 127 may be provided to an input Db of the fifth flip-flop 115. A positive output "Q" of the fifth flip-flop 115 may output a fifth digital bit Q5. A negative output Qb of the fifth flip-flop 115 may output the fifth inverted digital bit Qb5.

The converter 130 may convert the first to fifth digital bits Q1 to Q5 constituting a binary code to first to fifth gray bits G1 to G5 constituting a gray code. The converter 130 includes first to fourth converter logical operators 131 to 135.

The first converter logical operator 131 may perform an XOR operation on the first and second digital bits Q1 and Q2. An output of the first converter logical operator 131 may be the first gray bit G1. The second converter logical operator 132 may perform an XOR operation on the second and third digital bits Q2 and Q3. An output of the second converter logical operator 132 may be the second gray bit G2.

The third converter logical operator 133 may perform an XOR operation on the third and fourth digital bits Q3 and Q4. An output of the third converter logical operator 133 may be the third gray bit G3. The fourth converter logical operator 134 may perform an XOR operation on the fourth and fifth digital bits Q4 and Q5. An output of the fourth converter logical operator 134 may be the fourth gray bit G4.

The fifth converter logical operator 135 may perform an XOR operation on the fifth digital bit Q5 and a ground voltage VSS, that is, the low level. An output of the fifth converter logical operator 135 may be the fifth gray bit G5.

During one cycle of the clock signal CK, the counter 110 may increase a count of the first to fifth digital bits Q1 to Q5. That is, each of the first to fifth flip-flops 111 to 115 may transmit the input Db to the output "Q" during one cycle of the clock signal CK.

In the counter 110, a signal path, which is used to generate the fifth digital bit Q5 through the first flip-flop 111, the sixth counter logical operator 126, the seventh counter logical operator 127, and the fifth flip-flop 115, from among signal paths used to generate the first to fifth digital bits Q1 to Q5 in response to the clock signal CK may be the longest.

The longest signal path may be a critical path. In the case where a time (e.g., a critical time) needed to generate the fifth digital bit Q5 through the critical path is shorter than one cycle of the clock signal CK, the gray code generator 100 may count the first to fifth digital bits Q1 to Q5 without an error.

In the case where the critical time is identical to or longer than one cycle of the clock signal CK, the gray code generator 100 may not count the first to fifth digital bits Q1 to Q5, in particular, the fifth digital bit Q5. That is, the critical time acts as a limitation on a frequency of the clock signal CK and acts as a limitation on an operating speed of the gray code generator 100.

In particular, a level of a power supply voltage of an electronic device including the gray code generator 100 is decreasing as a low power continues to be required. In the case where the level of the power supply voltage decreases, a current per unit area consumed by the first to fifth flip-flops 111 to 115 or the first to seventh counter logical operators 121 to 127 increases, and a voltage drop by a resistance becomes severe.

As such, the operating speed of the first to fifth flip-flops 111 to 115 or the first to seventh counter logical operators 121 to 127 may decrease. The decrease in the operating speed of the first to fifth flip-flops 111 to 115 or the first to seventh counter logical operators 121 to 127 acts as a limitation in further suppressing the frequency of the clock signal CK or the operating speed of the gray code generator 100.

In addition, the converter 130 converts the first to fifth digital bits Q1 to Q5 to the first to fifth gray bits G1 to G5 by using the first to fifth converter logical operators 131 to 135. The first to fifth converter logical operators 131 to 135 have a nonlinearity that an operating speed varies with a pattern of the first to fifth digital bits Q1 to Q5.

For example, it is assumed that a first node of each of the first to fifth converter logical operators 131 to 135 has a specific value and a second node thereof toggles. According to this assumption, a speed at which each of the first to fifth converter logical operators 131 to 135 outputs a result of its own operation may vary with whether a value of the first node is the high level or the low level.

For another example, a speed at which each of the first to fifth converter logical operators 131 to 135 outputs a result of its own operation may vary with whether a voltage of the second node transitions from the high level to the low level or transitions from the low level to the high level. The variation of operating speed may cause a nonlinearity.

Figure 2:
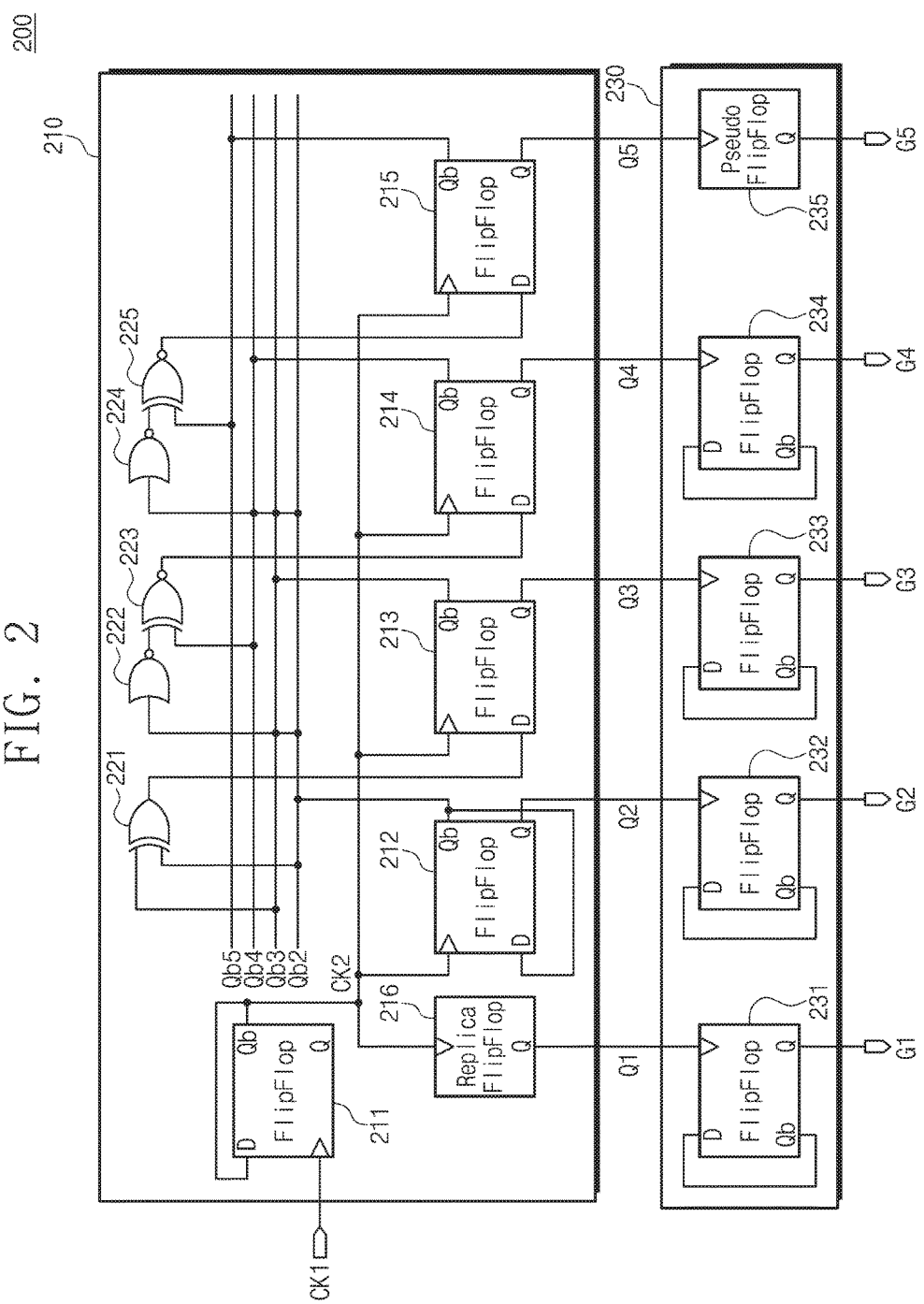
FIG. 2 is a diagram illustrating a gray code generator according to an example embodiment of the inventive concepts.

FIG. 2 is a diagram illustrating a gray code generator 200 according to another example embodiment of the inventive concepts.

Referring to FIG. 2, the gray code generator 200 includes a counter 210 and a converter 230.

The counter 210 may count the digital bits Q1 to Q5 constituting a binary code in response to a first clock signal CK1. For example, the counter 210 may sequentially increase the digital bits Q1 to Q5.

The counter 210 includes first to fifth counter flip-flops 211 to 215, a replica counter flip-flop 216, and the first to fifth logical operators 221 to 225. Each of the first to fifth counter flip-flops 211 to 215 may include a clock input to which the clock signal CK is input, an input "D", a positive output "Q", and a negative output "Qb".

Each of the second to fifth counter flip-flops 212 to 215 may transmit a logical level (e.g., a high level or a low level) of the input "D" to the positive output "Q" in synchronization with a falling edge of a second clock signal CK2. Each of the second to fifth counter flip-flops 212 to 215 may invert a logical level of the input "D" in synchronization with the falling edge of the second clock signal CK2 and may transmit a result of the inversion to the negative output Qb.

The first clock signal CK1 may be input to a clock input of the first counter flip-flop 211. The input "D" and the negative output Qb of the first counter flip-flop 211 may be connected to each other. A negative output Qb of the first counter flip-flop 211 may be output as the second clock signal CK2.

The first counter flip-flop 211 may transmit the input "D" to the negative output Qb in synchronization with a rising edge or the falling edge of the first clock signal CK1. Since a level of the second clock signal CK2 transitions in synchronization with the falling edge of the first clock signal CK1, the period of the second clock signal CK2 may be two times the period of the first clock signal CK1.

That is, the frequency of the second clock signal CK2 may be half the frequency of the first clock signal CK1. The first counter flip-flop 211 may be configured to divide the first clock signal CK1 and generate the second clock signal CK2, and may be called a "divider".

The replica counter flip-flop 216 may output the second clock signal CK2 as the first digital bit Q1. For example, a delay amount when the replica counter flip-flop 216 outputs the second clock signal CK2 as the first digital bit Q1 may be identical or substantially similar to a delay amount when the input "D" is transmitted to the output "Q" in each of the second to fifth counter flip-flops 212 to 215.

The input "D" and the negative output Qb of the second counter flip-flop 212 may be connected to each other. A positive output "Q" of the second counter flip-flop 212 may output the second digital bit Q2. A negative output Qb of the second counter flip-flop 212 may output the second inverted digital bit Qb2.

The first logical operator 221 may perform an XOR operation on the second inverted digital bit Qb2 and the third inverted digital bit Qb3. That is, the first logical operator 221 may output the high level when the second and third inverted digital bits Qb2 and Qb3 are different from each other, and may output the low level otherwise.

An output of the first logical operator 221 may be provided to an input "D" of the third counter flip-flop 213. A positive output "Q" of the third counter flip-flop 213 may output the third digital bit Q3. A negative output Qb of the third counter flip-flop 213 may output the third inverted digital bit Qb3.

The second logical operator 222 may perform a NOR operation on the second and third inverted digital bits Qb2 and Qb3. That is, the second logical operator 222 may output the high level when the second and third inverted digital bits Qb2 and Qb3 are at the high level, and may output the low level otherwise.

The third logical operator 223 may perform an XNOR operation on an output of the second logical operator 222 and the fourth inverted digital bit Qb4. That is, the third logical operator 223 may output the high level when the output of the second logical operator 222 and the fourth inverted digital bit Qb4 are identical to each other, and may output the low level otherwise.

An output of the third logical operator 223 may be provided to an input "D" of the fourth counter flip-flop 214. A positive output "Q" of the fourth counter flip-flop 214 may output the fourth digital bit Q4. A negative output Qb of the fourth counter flip-flop 214 may output the fourth inverted digital bit Qb4.

The fourth logical operator 224 may perform a NOR operation on the second to fourth inverted digital bits Qb2 to Qb4. The fifth logical operator 225 may perform an XNOR operation on an output of the fourth logical operator 224 and the fifth inverted digital bit Qb5.

An output of the fifth logical operator 225 may be provided to an input "D" of the fifth counter flip-flop 215. A positive output "Q" of the fifth counter flip-flop 215 may output the fifth digital bit Q5. A negative output Qb of the fifth counter flip-flop 215 may output the fifth inverted digital bit Qb5.

The converter 230 may convert the first to fifth digital bits Q1 to Q5 constituting a binary code to the first to fifth gray bits G1 to G5 constituting a gray code. The converter 230 may include first to fourth converter flip-flops 231 to 234 and a replica converter flip-flop 235.

Each of the first to fourth converter flip-flops 231 to 234 may transmit a logical level (e.g., the high level or the low level) of the input "D" to the positive output "Q" in synchronization with a rising edge of a signal provided to a clock input. Each of the second to fourth converter flip-flops 231 to 234 may invert a logical level of the input "D" in synchronization with the rising edge of the signal provided to the clock input and may transmit a result of the inversion to the negative output Qb.

The first digital bit Q1 may be provided to a clock input of the first converter flip-flop 231. An input "D" and a negative output Qb of the first converter flip-flop 231 may be connected to each other. A positive output "Q" of the first converter flip-flop 231 may output the first gray bit G1.

The second digital bit Q2 may be provided to a clock input of the second converter flip-flop 232. An input "D" and a negative output Qb of the second converter flip-flop 232 may be connected to each other. A positive output "Q" of the second converter flip-flop 232 may output the second gray bit G2.

The third digital bit Q3 may be provided to a clock input of the third converter flip-flop 233. An input "D" and a negative output Qb of the third converter flip-flop 233 may be connected to each other. A positive output "Q" of the third converter flip-flop 233 may output the third gray bit G3.

The fourth digital bit Q4 may be provided to a clock input of the fourth converter flip-flop 234. An input "D" and a negative output Qb of the fourth converter flip-flop 234 may be connected to each other. A positive output "Q" of the fourth converter flip-flop 234 may output the fourth gray bit G4.

The replica converter flip-flop 235 may output the fifth digital bit Q5 as the fifth gray bit G5. For example, a delay amount when the replica converter flip-flop 235 outputs the fifth digital bit Q5 as the fifth gray bit G5 may be identical or substantially similar to a delay amount when the input "D" is transmitted to the output "Q" in each of the first to fourth converter flip-flops 231 to 234.

The gray code generator 100 of FIG. 1 generates the first to fifth digital bits Q1 to Q5 in synchronization with the clock signal CK, and converts the first to fifth digital bits Q1 to Q5 to the first to fifth gray bits G1 to G5. Like the gray code generator 100, the gray code generator 200 generates the first to fifth digital bits Q1 to Q5 in synchronization with the first clock signal CK1, and converts the first to fifth digital bits Q1 to Q5 to the first to fifth gray bits G1 to G5.

The first to fifth flip-flops 111 to 115 and the first to seventh counter logical operators 121 to 127 of the gray code generator 100 of FIG. 1 operate in synchronization with the clock signal CK. In contrast, the first to fifth counter flip-flops 211 to 215, the replica counter flip-flop 216, and the first to fifth logical operators 221 to 225 of the gray code generator 200 operate in synchronization with the second clock signal CK2.

The gray code generator 200 generates the first to fifth digital bits Q1 to Q5 and the first to fifth gray bits G1 to G5 in synchronization with the first clock signal CK1. However, the second counter flip-flop 212 and the fifth counter flip-flop 215 forming a critical path of the gray code generator 200 operate in synchronization with the falling edge of the second clock signal CK2.

That is, like the gray code generator 100 of FIG. 1, the gray code generator 200 generates the first to fifth digital bits Q1 to Q5 and the first to fifth gray bits G1 to G5 every cycle of the clock signal CK1 or CK2. In this case, the critical time of the gray code generator 200 may be allowed by about two times the critical time of the gray code generator 100.

In the case where frequencies of the clock signal CK and the first clock signal CK1 are identically controlled, a time of one cycle of the second clock signal CK2 may be longer than a time of one cycle of the clock signal CK, for example, may be about two times the time of one cycle of the clock signal CK. In the case where frequencies of the clock signal CK and the second clock signal CK2 are identically controlled, a frequency of the first clock signal CK1 may be higher than a frequency of the clock signal CK, for example, may be about two times the frequency of the clock signal CK.

That is, when the critical time of the counter 210 is identical to the critical time of the counter 110, the gray code generator 200 may operate in response to the first clock signal CK1, the frequency of which is higher than a frequency of the clock signal CK of the gray code generator 100. That is, the operating speed of the gray code generator 200 may be higher than the operating speed of the gray code generator 100.

The critical time of the gray code generator 200 may be allowed to be longer than the critical time of the gray code generator 100. Accordingly, the gray code generator 200 may operate more appropriately for a low-power environment than the gray code generator 100.

When the frequency of the first clock signal CK1 is maintained identically to the frequency of the clock signal CK, the counter 210 may generate the first to fifth digital bits Q1 to Q5 depending on the second clock signal CK2, the frequency of which is lower than the frequency of the clock signal CK. Accordingly, a power consumed for the counter 210 to generate the first to fifth digital bits Q1 to Q5 may be reduced.

Compared with the converter 130 of FIG. 1, the converter 230 converts the first to fifth digital bits Q1 to Q5 to the first to fifth gray bits G1 to G5 by using the first to fourth converter flip-flops 231 to 234 and the replica converter flip-flop 235. Accordingly compared with the converter 130, the converter 230 has an improved linearity.

Figure 3:
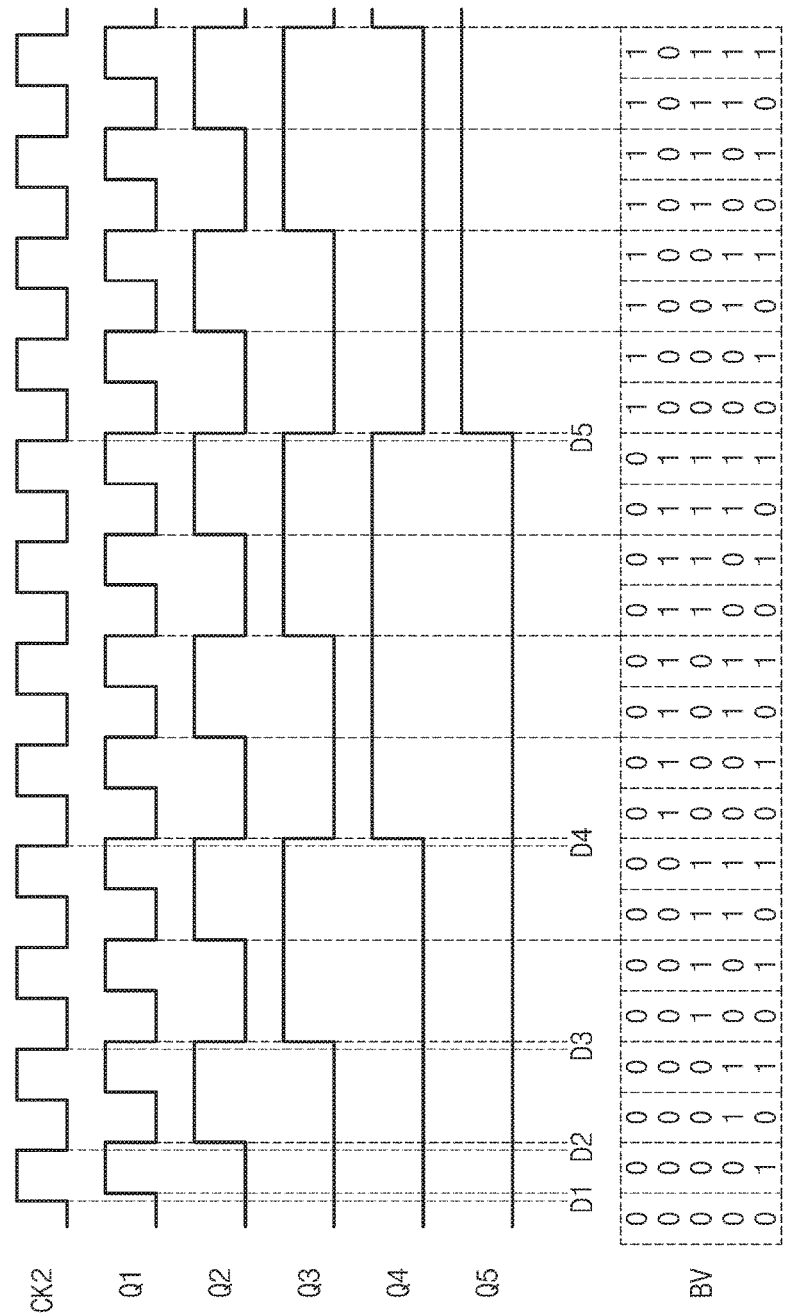
FIGS. 3 and 4 are timing diagrams illustrating an example in which a gray code generator generates first to fifth digital bits.
Figure 4:
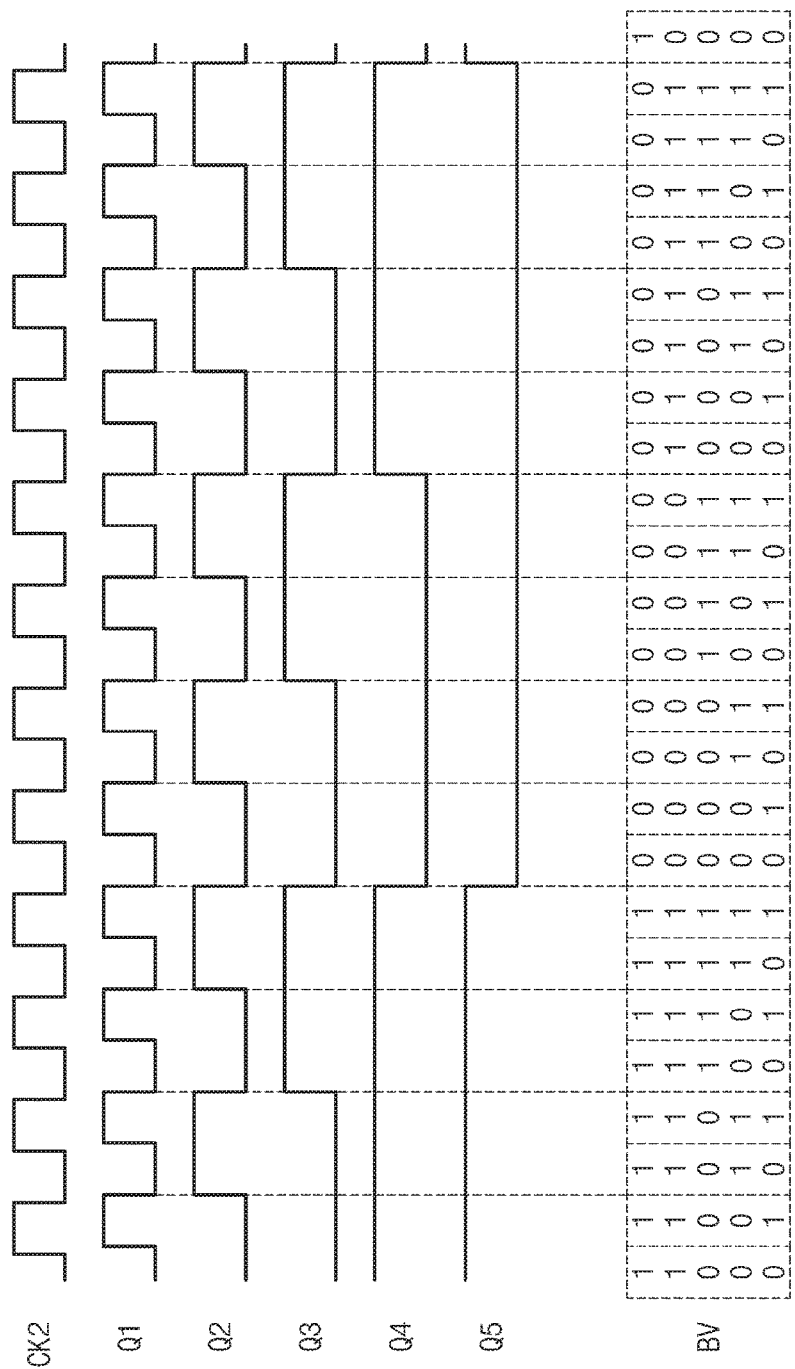

FIGS. 3 and 4 are timing diagrams illustrating an example in which the gray code generator 200 generates the first to fifth digital bits Q1 to Q5. In an example embodiment, an example in which a binary value BV composed of the first to fifth digital bits Q1 to Q5 increases from "00000" to "11111" and again increases from "00000" to "10000" are illustrated in FIGS. 3 and 4.

Referring to FIGS. 2 to 4, the replica counter flip-flop 216 outputs the second clock signal CK2 as the first digital bit Q1. That is, the first digital bit Q1 may have a waveform obtained by delaying the second clock signal CK2 by a first delay amount D1 at the replica counter flip-flop 216.

The second counter flip-flop 212 may output the negative output Qb, that is, a level of the second inverted digital bit Qb2 as the second digital bit Q2 in synchronization with the falling edge of the second clock signal CK2. It may be understood that the second counter flip-flop 212 inverts an input in synchronization with the falling edge of the second clock signal CK2. The second digital bit Q2 may by delayed by a second delay amount D2 through the second counter flip-flop 212.

When the second and third inverted digital bits Qb2 and Qb3 are different from each other, that is, when the second and third digital bits Q2 and Q3 are different from each other, the third counter flip-flop 213 may set the third digital bit Q3 to the high level in synchronization with the falling edge of the second clock signal CK2.

When the second and third inverted digital bits Qb2 and Qb3 are identical to each other, that is, when the second and third digital bits Q2 and Q3 are identical to each other, the third counter flip-flop 213 may set the third digital bit Q3 to the low level in synchronization with the falling edge of the second clock signal CK2. The third digital bit Q3 may be delayed by a third delay amount D3 through the third counter flip-flop 213.

For example, the second clock signal CK2 falls when the binary value BV is "00001". Since the second and third digital bits Q2 and Q3 are identical to each other, the third digital bit Q3 maintains the low level. The second clock signal CK2 falls when the binary value BV is "00011". Since the second and third digital bits Q2 and Q3 are different from each other, the third digital bit Q3 maintains the high level.

When the fourth inverted digital bit Qb4 is different from a result of performing the NOR operation on the second and third inverted digital bits Qb2 and Qb3, the fourth counter flip-flop 214 may set the fourth digital bit Q4 to the high level in synchronization with the falling edge of the second clock signal CK2.

When the fourth inverted digital bit Qb4 is identical to the result of performing the NOR operation on the second and third inverted digital bits Qb2 and Qb3, the fourth counter flip-flop 214 may set the fourth digital bit Q4 to the low level in synchronization with the falling edge of the second clock signal CK2. The fourth digital bit Q4 may be delayed by a fourth delay amount D4 through the fourth counter flip-flop 214.

For example, in the timing diagrams of FIGS. 3 and 4, in the case where a value of the second and third digital bits Q2 and Q3 is "11" when the second clock signal CK2 falls, the third digital bit Q3 may be inverted.

At the falling edge of the second clock signal CK2, when the binary value BV is "00111", the fourth digital bit Q4 may transition to the high level. At the falling edge of the second clock signal CK2, when the binary value BV is "01111", the fourth digital bit Q4 may transition to the low level.

At the falling edge of the second clock signal CK2, when the binary value BV is "10111", the fourth digital bit Q4 may transition to the high level. At the falling edge of the second clock signal CK2, when the binary value BV is "11111", the fourth digital bit Q4 may transition to the low level.

When the fifth inverted digital bit Qb5 is different from a result of performing the NOR operation on the second to fourth inverted digital bits Qb2 to Qb4, the fifth counter flip-flop 215 may set the fifth digital bit Q5 to the high level in synchronization with the falling edge of the second clock signal CK2.

When the fifth inverted digital bit Qb5 is identical to the result of performing the NOR operation on the second to fourth inverted digital bits Qb2 to Qb4, the fifth counter flip-flop 215 may set the fifth digital bit Q5 to the low level in synchronization with the falling edge of the second clock signal CK2. The fifth digital bit Q5 may be delayed by a fifth delay amount D5 through the fifth counter flip-flop 215.

For example, in the timing diagrams of FIGS. 3 and 4, in the case where a value of the second to fourth digital bits Q2 to Q4 is "111" when the second clock signal CK2 falls, the fifth digital bit Q5 may be inverted.

At the falling edge of the second clock signal CK2, when the binary value BV is "01111", the fifth digital bit Q5 may transition to the high level. At the falling edge of the second clock signal CK2, when the binary value BV is "11111", the fifth digital bit Q5 may transition to the low level.

Figure 5:
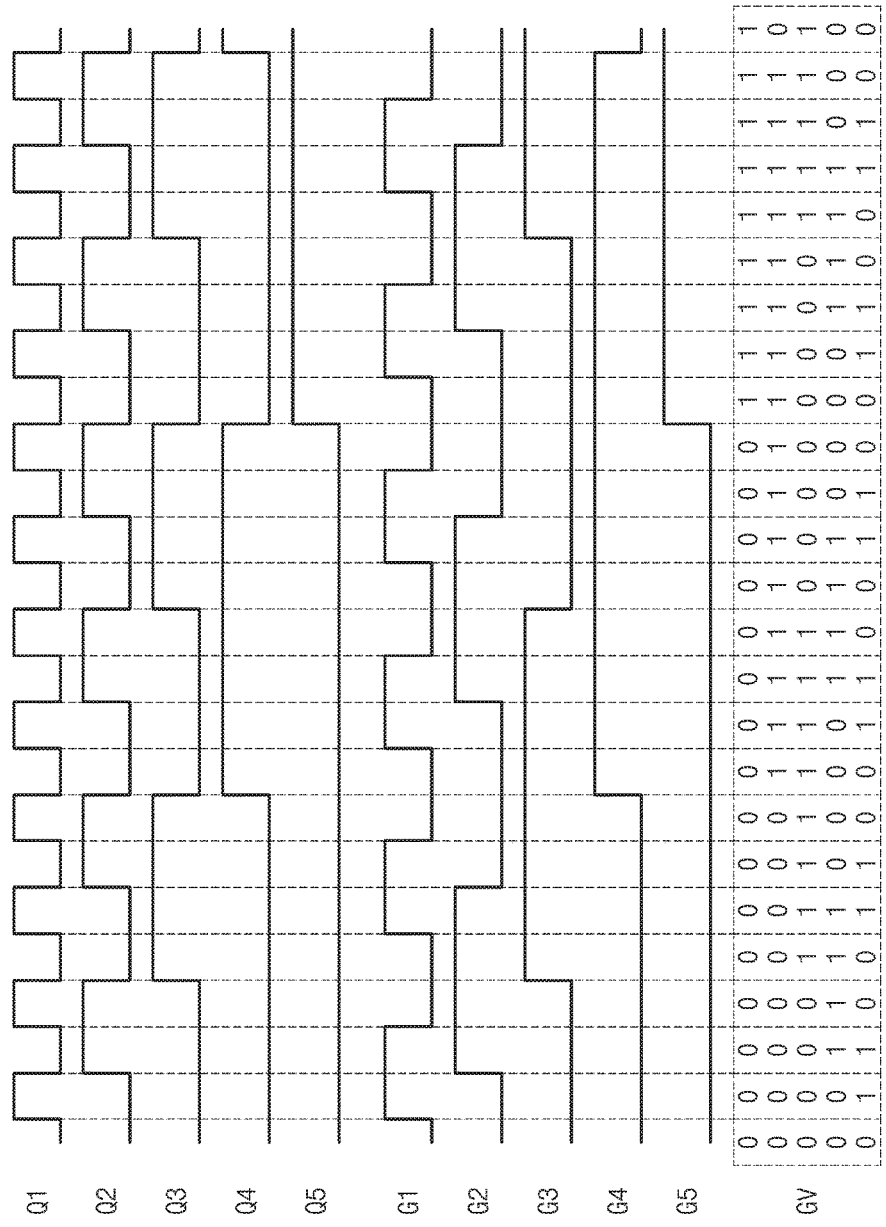
FIGS. 5 and 6 are timing diagrams illustrating an example in which a gray code generator converts first to fifth digital bits to first to fifth gray bits.
Figure 6:
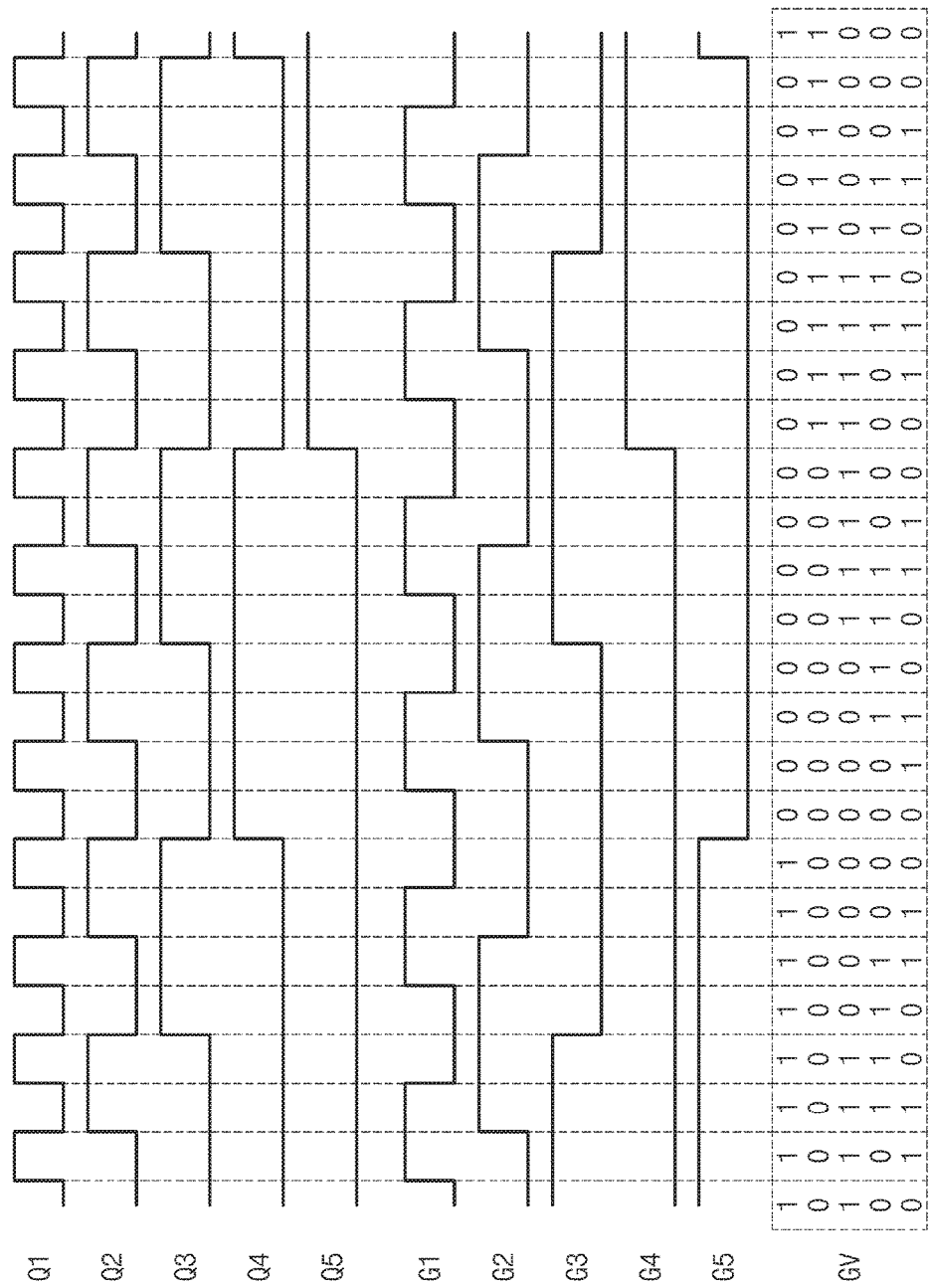

FIGS. 5 and 6 are timing diagrams illustrating examples in which the gray code generator 200 converts the first to fifth digital bits Q1 to Q5 to the first to fifth gray bits G1 to G5. In an example embodiment, an example in which the binary value BV is converted to a gray value GV when the binary value BV composed of the first to fifth digital bits Q1 to Q5 increases from "00000" to "11111" and again increases from "00000" to "10000" are illustrated in FIGS. 5 and 6.

Referring to FIGS. 2, 5, and 6, the first converter flip-flop 231 may invert the first gray bit G1 in synchronization with the rising edge of the first digital bit Q1. The second converter flip-flop 232 may invert the second gray bit G2 in synchronization with the rising edge of the second digital bit Q2.

The third converter flip-flop 233 may invert the third gray bit G3 in synchronization with the rising edge of the third digital bit Q3. The fourth converter flip-flop 234 may invert the fourth gray bit G4 in synchronization with the rising edge of the fourth digital bit Q4. The replica converter flip-flop 235 may output the fifth digital bit Q5 as the fifth gray bit G5.

As illustrated in FIGS. 5 and 6, a gray value GV may be used as a gray code in which the first to fifth gray bits G1 to G5 differ in only one bit.

Figure 7:
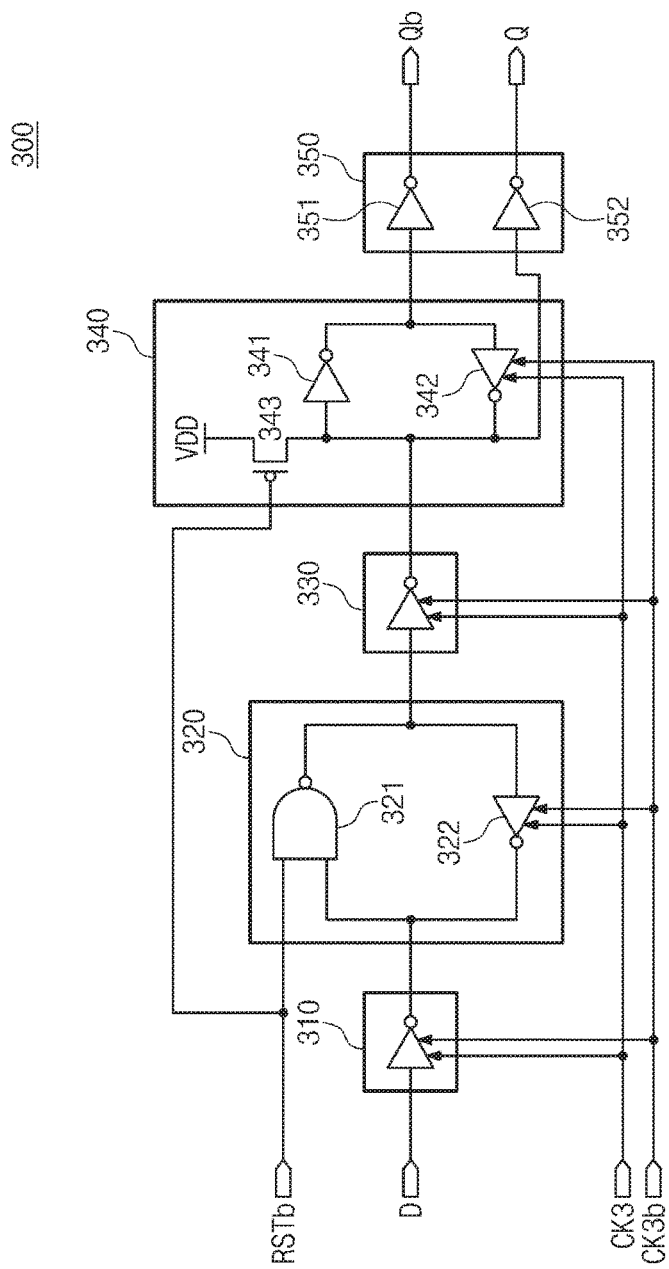
FIG. 7 is a diagram illustrating a flip-flop according to an example embodiment of the inventive concepts.

FIG. 7 is a diagram illustrating a flip-flop 300 according to an example embodiment of the inventive concepts. For example, the flip-flop 300 may correspond to one of the first to fifth counter flip-flops 211 to 215 or the first to fourth converter flip-flops 231 to 234.

Referring to FIG. 7, the flip-flop 300 includes an input block 310, a first latch block 320, a transmission block 330, a second latch block 340, and an output block 350.

The input block 310 may be connected to the input "D" of the flip-flop 300. The input block 310 may include an inverter which inverts and outputs a signal of the input "D" in response to a third clock signal CK3 and a third inverted clock signal CK3*b*.

The third clock signal CK3 may be the second clock signal CK2 or a corresponding digital bit of the first to fourth digital bits Q1 to Q4. The third inverted clock signal CK3*b* may be an inverted version of the third clock signal CK3.

The first latch block 320 may include a NAND operator 321 and a first latch inverter 322. The NAND operator 321 may include a first input to which a reset signal RSTb is input and a second input to which an output of the input block 310 is input. The NAND operator 321 may perform a NAND operation on the output of the input block 310 and the reset signal RSTb.

An output of the NAND operator 321 may be an output of the first latch block 320. The first latch inverter 322 may invert the output of the NAND operator 321 and may output a result of the inversion to the second input of the NAND operator 321. The first latch block 320 may store an output signal of the input block 310 and may invert and output the stored signal.

The transmission block 330 may transmit an output of the first latch block 320 to the second latch block 340 in response to the third clock signal CK3 and the third inverted clock signal CK3b. The transmission block 330 may include an inverter which inverts and outputs an output signal of the first latch block 320 in response to the third clock signal CK3 and the third inverted clock signal CK3b.

For example, when the flip-flop 300 is one of the second to fifth counter flip-flops 212 to 215, the transmission block 330 may operate in response to the falling edge of the third clock signal CK3 or the rising edge of the third inverted clock signal CK3b.

For example, when the flip-flop 300 is one of the first to fourth converter flip-flops 231 to 234, the transmission block 330 may operate in response to the rising edge of the third clock signal CK3 or the falling edge of the third inverted clock signal CK3b.

For example, when the flip-flop 300 is the first counter flip-flop 211, the transmission block 330 may operate in response to the rising edge or the falling edge of the third clock signal CK3 or the rising edge or the rising edge of the third inverted clock signal CK3b.

The second latch block 340 may include second and third latch inverters 341 and 342, and a transistor 343. The second latch inverter 341 may invert and output an output of the transmission block 330 or an output of the third latch inverter 342. The third latch inverter 342 may invert and output the output of the second latch inverter 341.

The transistor 343 may reset the second latch block 340 in response to the reset signal RSTb. The second latch block 340 may output a first signal transmitted through the transmission block 330 and a second signal corresponding to an inverted version of the first signal.

The output block 350 may output the first signal and the second signal of the second latch block 340 to the positive output "Q" and the negative output Qb. The output block 350 includes first and second output inverters 351 and 352. The first output inverter 351 may invert the second signal of the second latch block 340 and may output a result of the inversion to the negative output Qb. The second output inverter 352 may invert the first signal and may output a result of the inversion to the positive output "Q".

Figure 8:
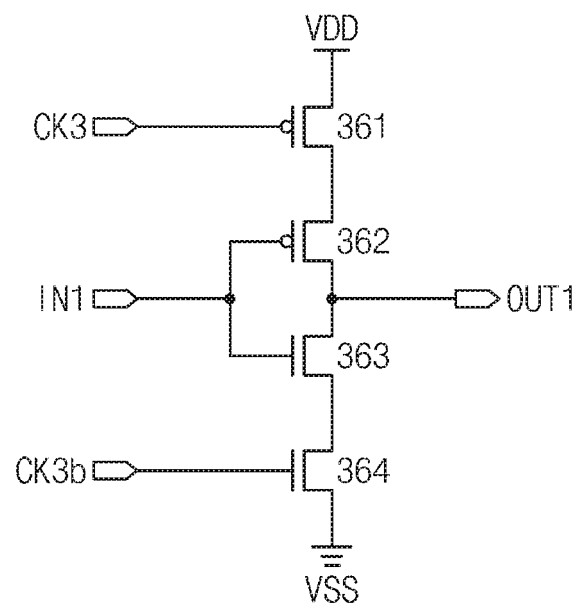
FIG. 8 is a diagram illustrating a first example of an inverter in a transmission block.

FIG. 8 is a diagram illustrating a first example of an inverter in the transmission block 330.

Referring to FIGS. 7 and 8, an inverter 360 includes first to fourth transistors 361 to 364 which are connected in series between a power node to which a power supply voltage VDD is supplied and a ground node to which a ground voltage VSS is supplied.

The first and second transistors 361 and 362 may be P-type transistors, and the third and fourth transistors 363 and 364 may be N-type transistors. The first transistor 361 may operate in response to the third clock signal CK3, and the fourth transistor 364 may operate in response to the third inverted clock signal CK3b.

The second and third transistors 362 and 363 may operate depending on a level of a first input IN1. A voltage of a node between the second and third transistors 362 and 363 may be a first output node OUT1.

When the third clock signal CK3 transitions to the low level, the first and fourth transistors 361 and 364 are turned on at the falling edge of the third clock signal CK3. Depending on a level of the first input IN1, one of the second and third transistors 362 and 363 may be turned on, and the other thereof may be turned off. That is, the inverter 360 may operate in synchronization with the falling edge of the third clock signal CK3.

Figure 9:
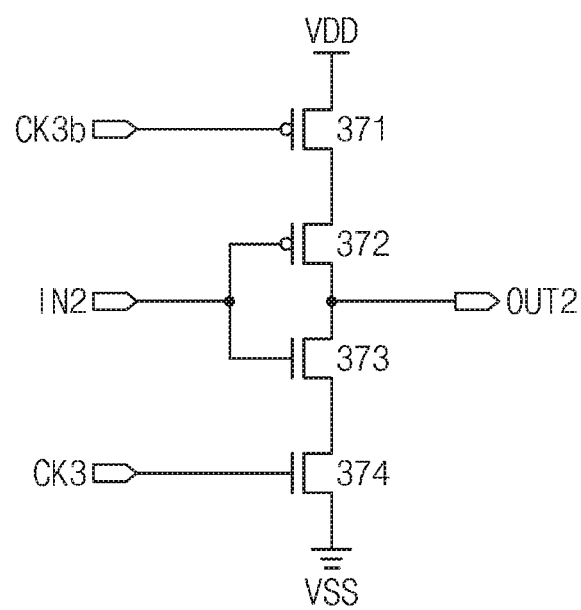
FIG. 9 is a diagram illustrating a second example of an inverter in a transmission block.

FIG. 9 is a diagram illustrating a second example of an inverter in the transmission block 330.

Referring to FIGS. 7 and 9, an inverter 370 includes first to fourth transistors 371 to 374 which are connected in series between a power node to which the power supply voltage VDD is supplied and a ground node to which the ground voltage VSS is supplied.

The first and second transistors 371 and 372 may be P-type transistors, and the third and fourth transistors 373 and 374 may be N-type transistors. The first transistor 371 may operate in response to the third inverted clock signal CK3b, and the fourth transistor 364 may operate in response to the third clock signal CK3.

The second and third transistors 372 and 373 may operate depending on a level of a second input IN2. A voltage of a node between the second and third transistors 372 and 373 may be a second output node OUT2.

When the third clock signal CK3 transitions to the high level, the first and fourth transistors 371 and 374 are turned on at the rising edge of the third clock signal CK3. Depending on a level of the second input IN2, one of the second and third transistors 372 and 373 may be turned on, and the other thereof may be turned off. That is, the inverter 370 may operate in synchronization with the rising edge of the third clock signal CK3.

Figure 10:
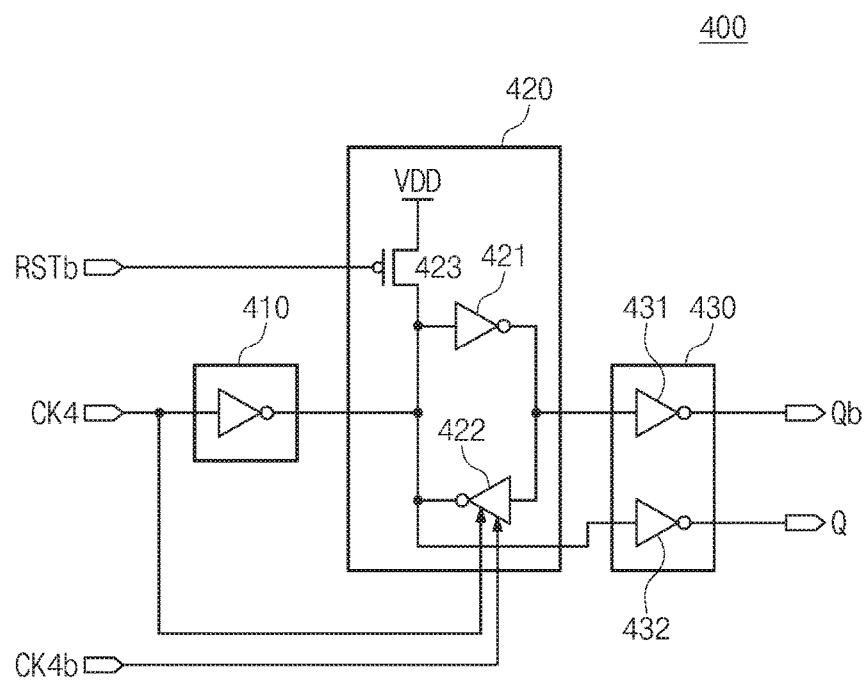
FIG. 10 a diagram illustrating a replica flip-flop according to an example embodiment of the inventive concepts.

FIG. 10 is a diagram illustrating a replica flip-flop 400 according to an example embodiment of the inventive concepts. For example, the replica flip-flop 400 may be the replica counter flip-flop 216 or the replica converter flip-flop 235.

Referring to FIGS. 2 and 10, the replica flip-flop 400 may include a transmission block 410, a latch block 420, and an output block 430.

The transmission block 410 may include an inverter which inverts and outputs a fourth clock signal CK4. The fourth clock signal CK4 may be the second clock signal CK2 or the fifth digital bit Q5.

The latch block 420 may include first and second inverters 421 and 422, and a transistor 423. The first inverter 421 may invert and output an output of the transmission block 410 or an output of the second inverter 422. The second inverter 422 may invert and output an output of the first inverter 421 in response to the fourth clock signal CK4 and a fourth inverted clock signal CK4b.

The transistor 423 may reset the latch block 420 in response to the reset signal RSTb. The latch block 420 may store a third signal output from the transmission block 410 and may output a fourth signal corresponding to an inverted version of the third signal. The output block 430 may transmit the third signal and the fourth signal of the latch block 420 to the positive output "Q" and the negative output Qb, respectively.

The output block 430 includes first and second output inverters 431 and 432. The first output inverter 431 may invert the fourth signal of the latch block 420 and may output a result of the inversion to the negative output Qb. The second output inverter 432 may invert the third signal of the latch block 420 and may output a result of the inversion to the positive output "Q". In an example embodiment, in the case where the negative output Qb is not used in the replica flip-flop 400, the negative output Qb may be omitted.

The flip-flop 300 described with reference to FIG. 7 outputs a signal stored in the first latch block 320 through the transmission block 330, the second latch block 340, and the output block 350 in response to the falling edge or the rising edge of the third clock signal CK3. The flip-flop 400 described with reference to FIG. 10 outputs the fourth clock signal CK4 through the transmission block 410, the latch block 420, and the output block 430.

In the case where the structure or size of the transmission block 330, the second latch block 340, and the output block 350 of the flip-flop 300 is identical to the structure or size of the transmission block 410, the latch block 420, and the output block 430 of the replica flip-flop 400, the transmission delay of the flip-flop 300 may be identical to the transmission delay of the replica flip-flop 400. Accordingly, the replica flip-flop 400 may compensate for or match the transmission delay of the flip-flop 300.

Figure 11:
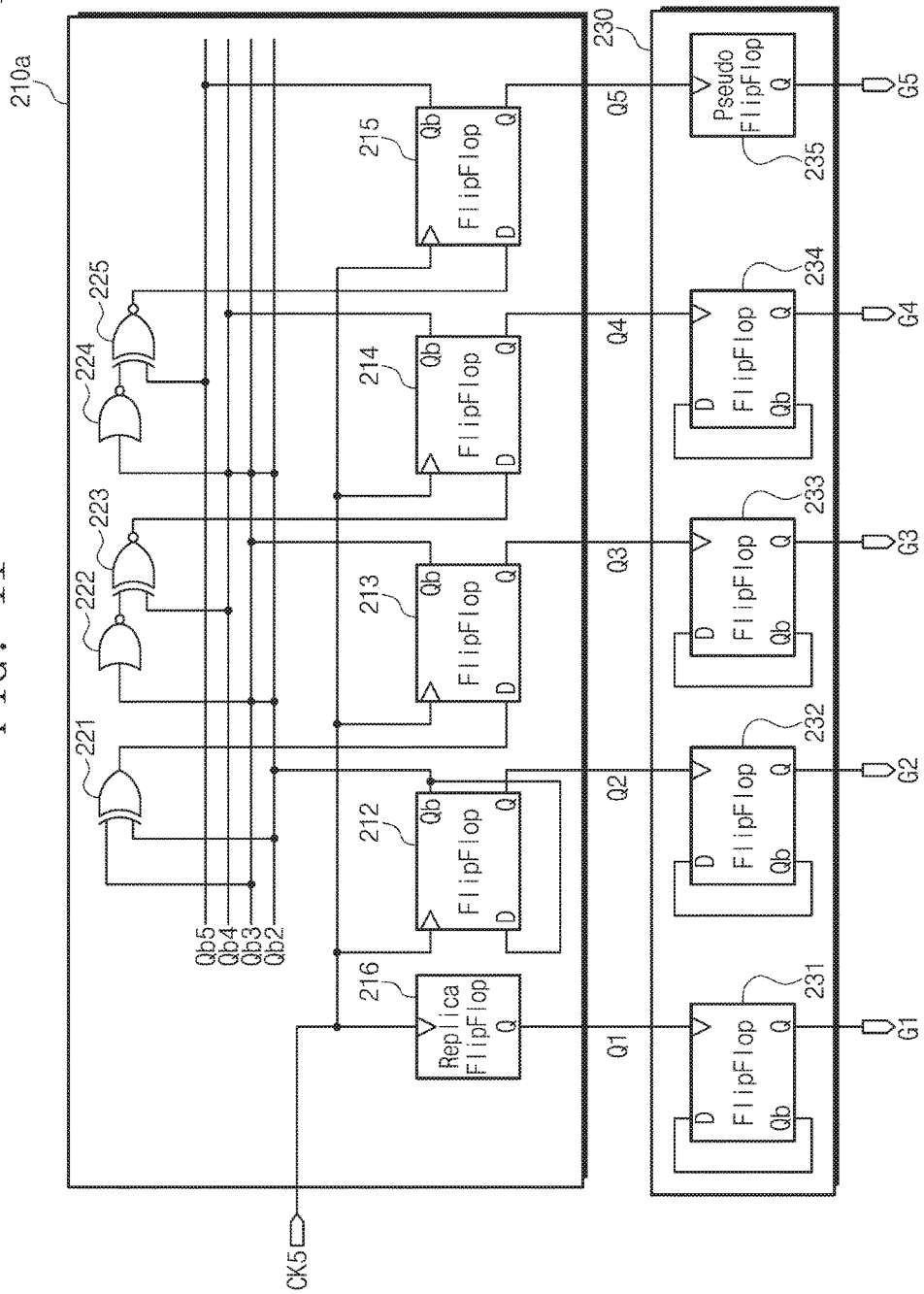
FIG. 11 is a diagram illustrating a gray code generator according to an application example of a gray code generator of FIG. 2.

FIG. 11 is a diagram illustrating a gray code generator 200a according to an application example of the gray code generator 200 of FIG. 2.

Referring to FIG. 11, the gray code generator 200a includes a counter 210a and the converter 230.

The converter 230 has the same structure as described with reference to FIG. 2 and operates the same manner as described with reference to FIG. 2. Thus, additional description will be omitted to avoid redundancy.

The counter 210a includes the second to fifth flip-flops 212 to 215, the replica counter flip-flop 216, and the first to fifth logical operators 221 to 225. Compared with the counter 210 of FIG. 2, the counter 210a does not include the first counter flip-flop 211.

The second to fifth flip-flops 212 to 215 and the replica counter flip-flop 216 may operate in response to a fifth clock signal CK5 provided from the outside. The gray code generator 200a may perform count and conversion in a period where the fifth clock signal CK5 is at the high level, and may further perform the count and conversion in a period where the fifth clock signal CK5 is at the low level.

Figure 12:
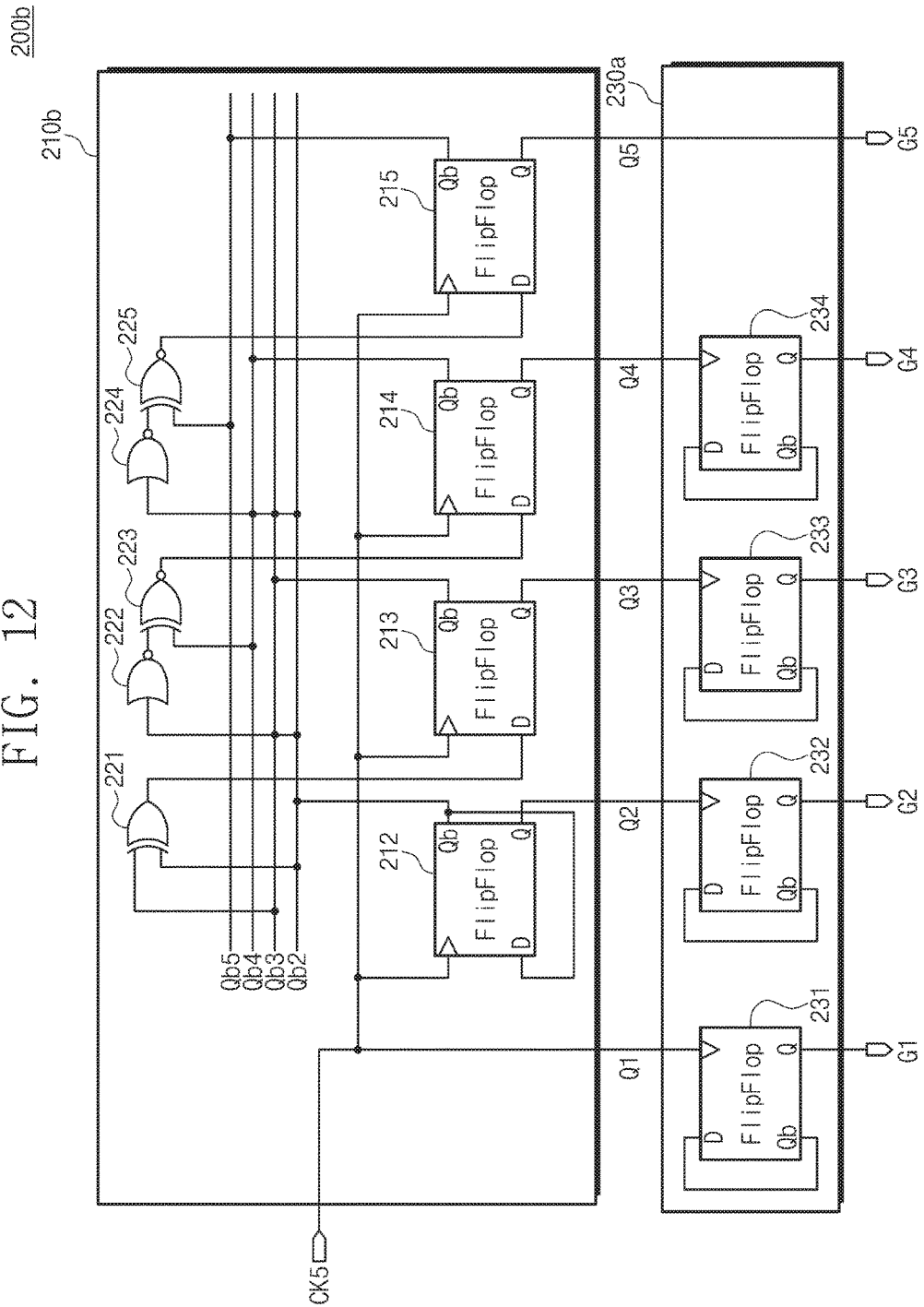
FIG. 12 is a diagram illustrating a gray code generator according to an application example of a gray code generator of FIG. 11.

FIG. 12 is a diagram illustrating a gray code generator 200b according to an application example of the gray code generator 200a of FIG. 11.

Referring to FIG. 12, the gray code generator 200b includes a counter 210b and a converter 230a.

Compared with the counter 210a of FIG. 11, the counter 210b does not include the replica counter flip-flop 216. Compared with the converter 230 of FIG. 11, the converter 230a does not include the replica converter flip-flop 235.

For example, in the case where a delay amount by the second to fifth converter flip-flops 212 to 215 and a delay amount by the first to fourth converter flip-flops 231 to 234 does not cause an operation error of the gray code generator 200b, the replica counter flip-flop 216 and the replica converter flip-flop 235 may be omitted.

In an example embodiment, as the first counter flip-flop 211 is positioned in the counter 210b as described with reference to FIG. 2, the replica counter flip-flop 216 and the replica converter flip-flop 235 may be omitted.

Figure 13:
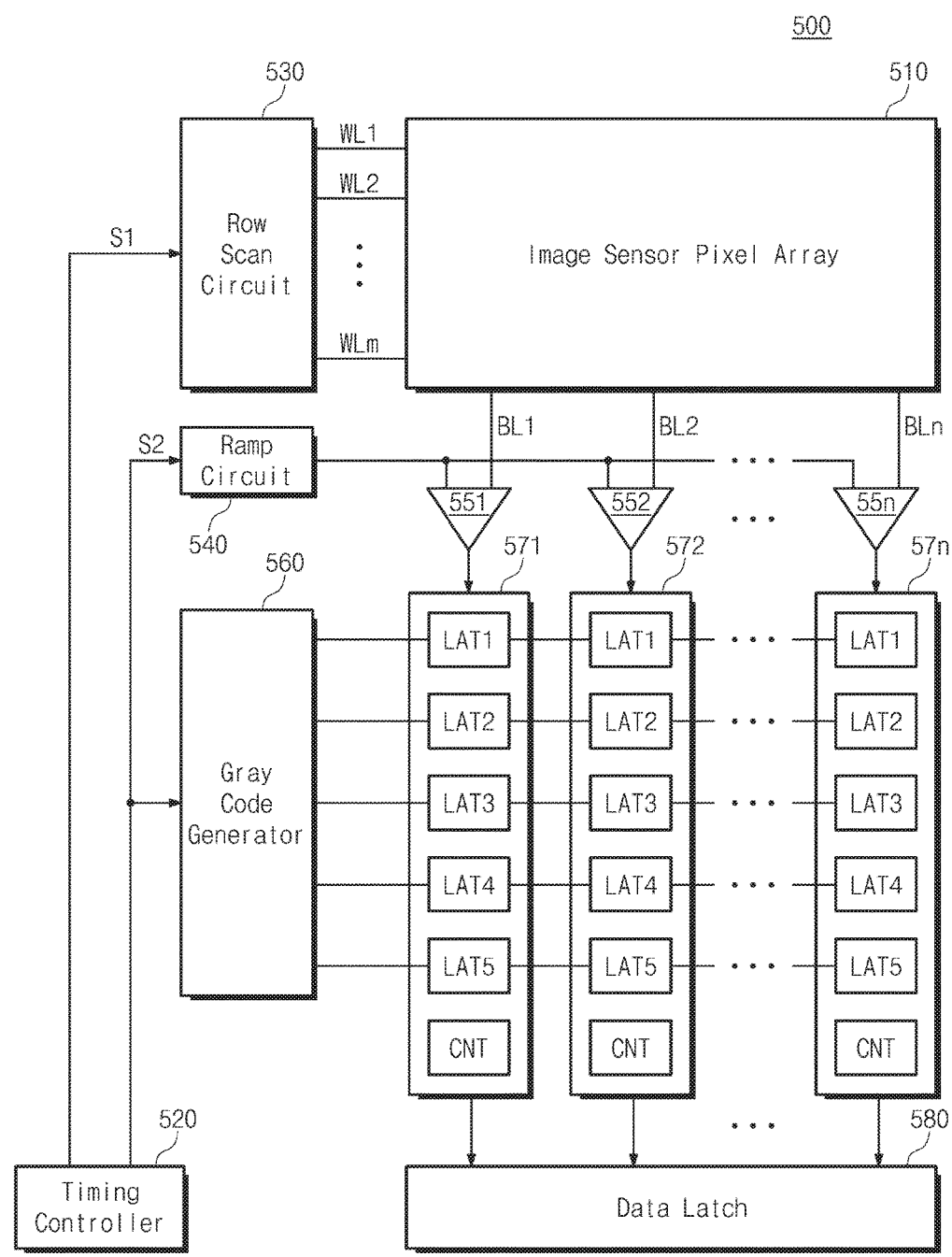
FIG. 13 is a block diagram illustrating an image processing device according to an example embodiment of the inventive concepts.

FIG. 13 is a block diagram illustrating an image sensing device 500 according to an example embodiment of the inventive concepts.

Referring to FIG. 13, the image sensing device 500 includes an image sensor pixel array 510, a timing controller 520, a row scan circuit 530, a ramp circuit 540, first to n-th comparators 551 to 55n, a gray code generator 560, first to n-th quantizers 571 to 57n, and a data latch 580.

The image sensor pixel array 510 may include image sensor pixels arranged in rows and columns. The image sensor pixel array 510 may generate image data in a way to sequentially scan the rows of the image sensor pixels. Image sensor pixels in a selected row may convert the amount of incident light in the form of a voltage. That is, the image sensor pixel array 510 may convert the amount of light to a voltage.

The timing controller 520 may provide a first signal S1 to the row scan circuit 530 and may provide a second signal S2 to the gray code generator 560. The timing controller 520 may control the first and second signals S1 and S2 such that the row scan circuit 530, the ramp circuit 540, and the gray code generator 560 operate at appropriate timings.

The row scan circuit 530 is connected to rows of the pixels in the image sensor pixel array 510 through first to m-th word lines WL1 to WLm. The row scan circuit 530 may sequentially select the first to m-th word lines WL1 to WLm in response to the first signal S1. The row scan circuit 530 may apply an activation voltage (e.g., a positive voltage) to a selected word line and may apply a deactivation voltage (e.g., a ground voltage) to unselected word lines.

The ramp circuit 540 may generate a gradually increasing (or decreasing) voltage in response to the second signal S2. Voltages generated by the ramp circuit 540 may be provided to the first to n-th comparators 551 to 55n.

Each of the first to n-th comparators 551 to 55n may include a first node to which a corresponding voltage from the ramp circuit 540 is input, and a second node connected to a corresponding column of the columns of the pixels in the image sensor pixel array 510 through first to n-th bit lines BL1 to BLn.

Each of the first to n-th comparators 551 to 55n may compare a voltage of the first node and a voltage of the second node. For example, each of the first to n-th comparators 551 to 55n may output the high level (or the low level) when the voltage of the first node is greater than the voltage of the second node. Each of the first to n-th comparators 551 to 55n may output the low level (or the high level) when the voltage of the first node is not greater than the voltage of the second node.

A voltage of the first node of each of the first to n-th comparators 551 to 55n gradually increases or decreases. Accordingly, a length of a period where an output signal of each of the first to n-th comparators 551 to 55n is at the high level (or at the low level) varies with the voltage of the second node of each of the first to n-th comparators 551 to 55n. That is, each of the first to n-th comparators 551 to 55n may convert a voltage of a bit line to a pulse width.

The gray code generator 560 may generate a gray code. For example, the gray code generator 560 may include one of the gray code generators 200, 200a, and 200b described with reference to FIGS. 2 to 12. Gray bits generated by the gray code generator 560 may be provided to the first to n-th quantizers 571 to 57n.

The first to n-th quantizers 571 to 57n may convert outputs of the first to n-th comparators 551 to 55n to digital values. Each of the first to n-th quantizers 571 to 57n may include first to fifth latches LAT1 to LAT5, and a counter CNT. The first to fifth latches LAT1 to LAT5 may respectively receive the gray bits from the gray code generator 560. Each of the first to fifth latches LAT1 to LAT5 may store a corresponding gray bit in synchronization with a rising edge (or a falling edge) of an output from a corresponding comparator.

The counter CNT may start to count when the ramp circuit 540 starts to adjust (e.g., increase or decrease) an output voltage from an initial value. For example, the counter CNT may increase a count when values of the gray bits G1 to G5 circles from "00000" to "10000" as described with reference to FIGS. 5 and 6.

For example, the counter CNT may generate upper bits of a quantization value of a corresponding quantizer. The first to fifth latches LAT1 to LAT5 may generate lower bits of a quantization value of a corresponding quantizer.

The data latch 580 may receive and store quantized values from the first to n-th quantizers 571 to 57n. The values stored in the data latch 580 may be used as a data image.

As described above, while the gray code generator 560 performs a count operation, an image sensing operation of the image sensing device 500 is at a standby state. Accordingly, as described with reference to FIGS. 2 to 12, in the case where an operating speed of the gray code generator 560 is improved, a speed (e.g., a scanning interval or a scanning frequency) at which the image sensing device 500 senses an image may be improved, and the quality of image data may be improved.

Also, as described with reference to FIGS. 2 to 12, the gray code generator 560 may be appropriate for a low-power environment. Accordingly, the image sensing device 500 may operate with a low power. Also, the gray code generator 560 suppresses a digital nonlinearity (DNL) that a speed varies with an input. Accordingly, the reliability of the image sensing device 500 may be improved.

Figure 14:
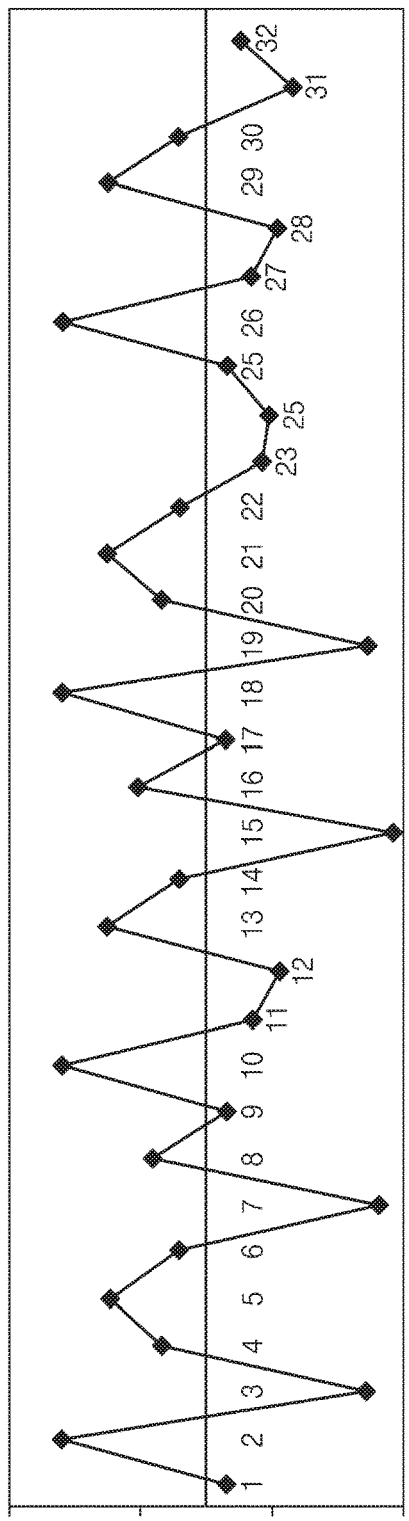
FIG. 14 is a diagram illustrating a digital nonlinearity which occurs upon generating gray codes by using first to fifth converter logical operators as described with reference to FIG. 1.

When the gray code generator performs counting, the digital nonlinearity (DNL) may occur. FIG. 14 is a diagram illustrating a digital nonlinearity which occurs upon generating gray codes by using the first to fifth converter logical operators 131 to 135 as described with reference to FIG. 1.

In FIG. 14, a horizontal axis represents a value of the digital bits Q1 to Q5 input to the converter 130. A vertical axis represents a change in a time taken for the converter 130 to perform conversion. Referring to FIG. 14, a conversion time of the converter 130 varies with whether the digital bits Q1 to Q5 have any value (or pattern). Accordingly, the digital nonlinearity (DNL) occurs.

Figure 15:
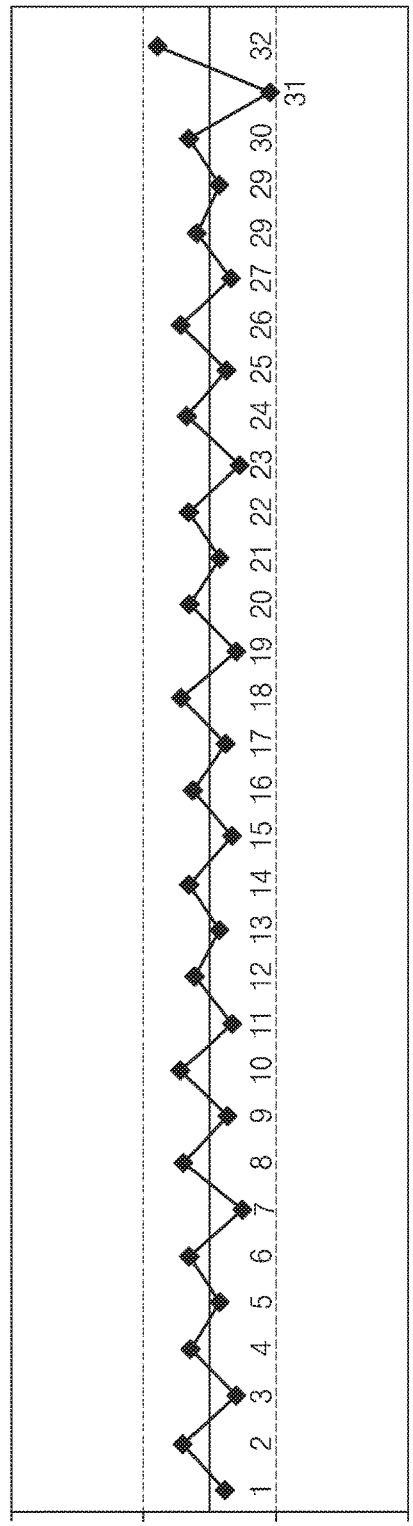
FIG. 15 is a diagram illustrating a digital nonlinearity which occurs upon generating gray codes by using first to fourth converter flip-flops and a pseudo converter flip-flop as described with reference to FIG. 2.

FIG. 15 is a diagram illustrating a digital nonlinearity which occurs upon generating gray codes by using the first to fourth converter flip-flops 231 to 234 and the pseudo converter flip-flop 235 as described with reference to FIG. 2. Even though a value (or pattern) of the digital bits Q1 to Q5 varies, the conversion time is measured as being suppressed compared with FIG. 14. That is, by using the gray code generator 200, 200a, or 200b according to an example embodiment of the inventive concepts, the digital nonlinearity of the image sensing device 500 is suppressed, and the quality of image data is improved.

An example of a gray code generator which counts the first to fifth digital bits Q1 to Q5 and converts the first to fifth digital bits Q1 to Q5 to the first to fifth gray bits G1 to G5 is described in the above example embodiments. However, the numbers of digital bits and gray bits which the gray code generator according to example embodiments of the inventive concepts generates is not limited thereto.

In the above-described example embodiments, components according to example embodiments of the inventive concepts are referred to by using the term "block". The "block" may be implemented with various hardware devices, such as an integrated circuit, an application specific IC (ASCI), a field programmable gate array (FPGA), and a complex programmable logic device (CPLD), software, such as firmware and applications driven in hardware devices, or a combination of a hardware device and software. Also, "block" may include circuits or intellectual property (IP) implemented with semiconductor devices.

For example, the units and/or devices described above, such as the components of the image sensing device (e.g., 500) including the gray code generator (e.g., 200, 200a, and 200b) as well as the sub-components thereof including elements of the counter (e.g., 210, 210a, 210b) such as the counter flip-flops (e.g., 211 to 215), the replica counter flip-flop (e.g., 216) and counter logical operators (e.g., 221 to 225) and elements of the converter (e.g., 230 and 230a) such as the converter flip-flops (e.g., 231 to 234) and the replica converter flip-flop (e.g., 235) may be implemented using hardware, a combination of hardware and software, or a non-transitory storage medium storing software that is executable to perform the functions of the same.

Hardware may be implemented using processing circuitry such as, but not limited to, one or more processors, one or more Central Processing Units (CPUs), one or more controllers, one or more arithmetic logic units (ALUs), one or more digital signal processors (DSPs), one or more microcomputers, one or more field programmable gate arrays (FPGAs), one or more System-on-Chips (SoCs), one or more programmable logic units (PLUs), one or more microprocessors, one or more Application Specific Integrated Circuits (ASICs), or any other device or devices capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, etc., capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., one or more processors, CPUs, controllers, ALUs, DSPs, microcomputers, microprocessors, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor. In another example, the hardware device may be an integrated circuit customized into special purpose processing circuitry (e.g., an ASIC).

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Software and/or data may be embodied permanently or temporarily in any type of storage media including, but not limited to, any machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including tangible or non-transitory computer-readable storage media as discussed herein.

Storage media may also include one or more storage devices at units and/or devices according to one or more example embodiments. The one or more storage devices may be tangible or non-transitory computer-readable storage media, such as random access memory (RAM), read only memory (ROM), a permanent mass storage device (such as a disk drive), and/or any other like data storage mechanism capable of storing and recording data. The one or more storage devices may be configured to store computer programs, program code, instructions, or some combination thereof, for one or more operating systems and/or for implementing the example embodiments described herein.

The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the storage media, the computer programs, program code, instructions, or some combination thereof, may be specially designed and constructed for the purposes of the example embodiments, or they may be known devices that are altered and/or modified for the purposes of example embodiments.

According to an example embodiment of the inventive concepts, a frequency of a clock signal supplied to a gray code generator may be increased. Accordingly, the gray code generator having an improved operating speed is improved. Also, according to an example embodiment of the inventive concepts, the frequency of the clock signal supplied to the gray code generator may be decreased while maintaining the operating speed of the gray code generator. Accordingly, the gray code generator having reduced power consumption may be provided. Also, according to example embodiments of the inventive concepts, the gray code generator converts digital bits to gray bits by using flip-flops. Accordingly, the gray code generator having an improved linearity may be provided.

While example embodiments of the inventive concepts have been described with reference to some example embodiments thereof, it will be apparent to those of ordinary skill in the art that various changes and modifications may be made thereto without departing from the spirit and scope of example embodiments of the inventive concepts as set forth in the following claims.

What is claimed is:

1. A gray code generator comprising:
a converter configured to convert digital bits to gray bits, the digital bits including a first digital bit, a second digital bit, a third digital bit and a fourth digital bit, and the gray bits including a first gray bit, a second gray bit, a third gray bit and a fourth gray bit; and
a counter configured to generate the digital bits by performing a counting operation in response to a clock signal, the counter including,
a replica counter flip-flop configured to output the clock signal as the first digital bit, and
a plurality of counter flip-flops including,
a first counter flip-flop configured to output the second digital bit, in response to the clock signal,
a second counter flip-flop configured to output a high level as the third digital bit in response to the clock signal when a second inverted digital bit corresponding to an inverted version of the second digital bit is different from a third inverted digital bit corresponding to an inverted version of the third digital bit, and
a third counter flip-flop configured to output the high level as the fourth digital bit in response to the clock signal when a result of performing a NOR operation on the second inverted digital bit and the third inverted digital bit is same as a fourth inverted digital bit, the fourth inverted digital bit corresponding to an inverted version of the fourth digital bit.

2. The gray code generator of claim 1, wherein the replica counter flip-flop includes:
a first inverter configured to invert the clock signal to output an inverted clock signal;
a first latch configured to store the inverted clock signal; and
a second inverter configured to invert the inverted clock signal to output the first digital bit.

3. The gray code generator of claim 2, wherein each of the plurality of counter flip-flops include:
an input unit configured to output an input signal as a first signal;
a second latch configured to store the first signal, and to invert the first signal to output a second signal;
a third inverter configured to invert the second signal to generate a third signal, in response to the clock signal;
a third latch configured to store the third signal, and to invert the third signal to output a fourth signal; and
a fourth inverter configured to invert the fourth signal to generate a corresponding one of the second digital bit, the third digital bit and the fourth digital bit.

4. The gray code generator of claim 3, wherein the first inverter, the first latch, and the second inverter have a same structure as the third inverter, the third latch, and the fourth inverter, respectively.

5. The gray code generator of claim 3, wherein a first transmission delay from the first inverter, through the first latch, and to the second inverter is same as a second transmission delay from the third inverter, through the third latch, and to the fourth inverter.

6. The gray code generator of claim 1, wherein the counter further includes:
a divider configured to receive a second clock signal, and to divide the second clock signal to generate the clock signal.

7. The gray code generator of claim 6, wherein the divider includes:
a counter flip-flop including an input node and an output node, the counter flip-flop configured to output the clock signal to the output node thereof in response to the second clock signal, the input node being connected to the output node.

8. The gray code generator of claim 1, wherein the replica counter flip-flop, and the plurality of counter flip-flops operate in synchronization with a falling edge of the clock signal.

9. The gray code generator of claim 1, wherein the converter includes:
a plurality of converter flip-flops including a first converter flip-flop, a second converter flip-flop and a third converter flip-flop, the plurality of converter flip-flops configured to convert respective ones of the first digital bit, the second digital bit and the third digital bit to respective ones of the first gray bit, the second gray bit and the third gray bit; and
a replica converter flip-flop configured to convert the fourth digital bit to the fourth gray bit.

10. The gray code generator of claim 9, wherein each of the plurality of converter flip-flops includes,
a data input;
a negative output connected to the data input;
a clock input configured to receive a corresponding one of the first digital bit, the second digital bit and the third digital bit; and
a positive output configured to output a corresponding one of the first gray bit, the second gray bit and the third gray bit.

11. The gray code generator of claim 9, wherein the replica converter flip-flop is configured to output the fourth digital bit as the fourth gray bit.

12. A gray code generator comprising:
a counter configured to generate digital bits by performing a counting operation in response to a clock signal, the digital bits including a first digital bit, a second digital bit, a third digital bit and a fourth digital bit; and
a converter configured to convert the digital bits to gray bits, the gray bits including a first gray bit, a second gray bit, a third gray bit and a fourth gray bit, the converter including,
a plurality of converter flip-flops including a first converter flip-flop, a second converter flip-flop and a third converter flip-flop, the plurality of converter flip-flops configured to convert respective ones of the first digital bit, the second digital bit and the third digital bit to respective ones of the first gray bit, the second gray bit and the third gray bit; and
a replica converter flip-flop configured to convert the fourth digital bit to the fourth gray bit.

13. The gray code generator of claim 12, wherein the replica converter flip-flop includes:
a first inverter configured to invert the fourth digital bit to output an inverted signal;
a first latch configured to store the inverted signal; and
a second inverter configured to invert the inverted signal to output the fourth gray bit.

14. The gray code generator of claim 13, wherein each of the plurality of converter flip-flops include:
an input unit configured to output a corresponding one of the first digital bit, the second digital bit and the third digital bit as a first signal;
a second latch configured to store the first signal, and to invert the first signal to output a second signal;
a third inverter configured to invert the second signal to generate a third signal, in response to the corresponding one of the first digital bit, the second digital bit and the third digital bit;
a third latch configured to store the third signal, and to invert the third signal to output a fourth signal; and
a fourth inverter configured to invert the fourth signal to generate one of the gray bits corresponding to the corresponding one of the first digital bit, the second digital bit and the third digital bit.

15. The gray code generator of claim 14, wherein the first inverter, the first latch, and the second inverter have a same structure as the third inverter, the third latch, and the fourth inverter, respectively.

16. The gray code generator of claim 14, wherein a first transmission delay from the first inverter, through the first latch, and to the second inverter is same as a second transmission delay from the third inverter, through the third latch, and to the fourth inverter.

17. A gray code generator comprising:
a counter configured to generate digital bits by performing a counting operation in response to a clock signal, the digital bits including a first digital bit, a second digital bit, a third digital bit and a fourth digital bit; the counter including,
a first counter flip-flop configured to generate the second digital bit, in response to the clock signal;
a second counter flip-flop configured to output a high level as the third digital bit in response to the clock signal when a second inverted digital bit corresponding to an inverted version of the second digital bit is different from a third inverted digital bit corresponding to an inverted version of the third digital bit; and
a third counter flip-flop configured to output the high level as the fourth digital bit in response to the clock signal when a result of performing a NOR operation on the second inverted digital bit and the third inverted digital bit is same as a fourth inverted digital bit, the fourth inverted digital bit corresponding to an inverted version of the fourth digital bit; and
a converter configured to convert the digital bits to gray bits, the converter including a first converter flip-flop, a second converter flip-flop and a third converter flip-flop configured to convert respective ones of the first digital bit, the second digital bit and the third digital bit to respective ones of a first gray bit, a second gray bit and a third gray bit included in the gray bits.

18. The gray code generator of claim 17, wherein the counter is configured to output the clock signal as the first digital bit.

19. The gray code generator of claim 17, wherein the converter is configured to output the fourth digital bit as a fourth gray bit of the gray bits.

20. The gray code generator of claim 17, wherein each of the first converter flip-flop, the second converter flip-flop and the third converter flip-flop operates in synchronization with a rising edge of a corresponding one of the first digital bit, the second digital bit and the third digital bit.

* * * * *